United States Patent [19]
Selna

[11] Patent Number: 5,741,729
[45] Date of Patent: Apr. 21, 1998

[54] BALL GRID ARRAY PACKAGE FOR AN INTEGRATED CIRCUIT

[75] Inventor: Erich Selna, Mountain View, Calif.

[73] Assignee: Sun Microsystems, Inc., Palo Alto, Calif.

[21] Appl. No.: 461,299

[22] Filed: Jun. 5, 1995

Related U.S. Application Data

[62] Division of Ser. No. 273,331, Jul. 11, 1994.

[51] Int. Cl.$^6$ ..................................... H01L 21/60
[52] U.S. Cl. ............................. 438/125; 438/126
[58] Field of Search ......................... 257/691, 698; 437/213, 215, 218

[56] References Cited

U.S. PATENT DOCUMENTS

| | | | |
|---|---|---|---|
| 3,239,469 | 3/1966 | Dougherty, Jr. | 361/792 |
| 3,568,000 | 3/1971 | D'Aboville | 361/794 |
| 3,582,865 | 6/1971 | Franck et al. | 361/748 |
| 4,513,355 | 4/1985 | Schroeder et al. | 361/403 |
| 4,535,385 | 8/1985 | August et al. | 361/748 |
| 4,739,448 | 4/1988 | Rowe et al. | 361/386 |
| 4,866,841 | 9/1989 | Hubbard | 29/845 |
| 5,010,641 | 4/1991 | Sisler | 29/830 |
| 5,012,386 | 4/1991 | McShane et al. | 361/386 |
| 5,102,829 | 4/1992 | Cohn | 757/697 |
| 5,264,729 | 11/1993 | Rostoker et al. | 257/693 |
| 5,291,062 | 3/1994 | Higgins, III | 257/693 |
| 5,355,283 | 10/1994 | Marrs et al. | 257/787 |
| 5,397,917 | 3/1995 | Ommen et al. | 257/698 |
| 5,468,999 | 11/1995 | Lin et al. | 257/784 |
| 5,490,324 | 2/1996 | Newman | 437/207 |
| 5,508,556 | 4/1996 | Lin | 257/698 |
| 5,521,435 | 5/1996 | Mizukoshi | 257/698 |

FOREIGN PATENT DOCUMENTS

| | | |
|---|---|---|
| 162521 | 11/1985 | European Pat. Off. . |
| 376100 | 7/1990 | European Pat. Off. . |
| 399161 | 11/1990 | European Pat. Off. . |

OTHER PUBLICATIONS

Tummala et al. Eds., Microelectronics Packaging Handbook, Van Nostrand Reinhold, pp. 687–691, 1989.

Primary Examiner—John Niebling
Assistant Examiner—Kevin F. Turner
Attorney, Agent, or Firm—Flehr Hohbach Test Albritton & Herbert LLP

[57] ABSTRACT

A three-layer BGA package includes a BGA Vss plane disposed between upper and lower BGA package traces, and also includes upper and lower BGA package Vss traces on the outer periphery of the BGA package. Vias electrically and thermally couple the BGA Vss plane to upper and lower BGA package Vss traces. Other vias electrically couple Vdd and IC signals from Vdd and signal traces on the upper and lower surfaces of the BGA package. Solder balls connected to the BGA package lower traces are soldered to matching traces on a system PCB. The periphery Vss traces, vias and solder balls help maintain current flow in the BGA Vss plane. In addition to providing a low impedance current return path (and thus reduced ground bounce and reduced IC signal delay time) for current sunk by an IC within the BGA package, the BGA Vss plane provides heat sinking. A four-layer BGA package further includes a BGA Vdd plane located intermediate the BGA Vss plane and the traces on the lower surface of the BGA package. Fabricated from two pieces of symmetrical printed circuit board material, this embodiment reduces ground bounce for IC current sourcing as well as IC current sinking, and provides approximately a 100% improvement in thermal dissipation as compared to prior art BGA packages.

18 Claims, 4 Drawing Sheets

BALL GRID ARRAY PACKAGE FOR AN INTEGRATED CIRCUIT

This is a division, of application Ser. No. 08/273,331 filed Jul. 11, 1994.

FIELD OF THE INVENTION

This invention relates to packaging integrated circuits, and more particularly to improving thermal and electrical characteristics in ball grid array packaging for high speed integrated circuits.

BACKGROUND OF THE INVENTION

Integrated circuits ("ICs") are fabricated on a semiconductor substrate that is mounted within a typically epoxy or ceramic overmold for later mounting on a printed circuit board ("PCB"). As fabrication techniques improve, ICs tend to include circuits with increased complexity and increased number of input and output leads ("pinouts"). Further, as more transistors are fabricated on an IC die of a given size, dissipating heat from the IC becomes a greater challenge.

Figure 1:
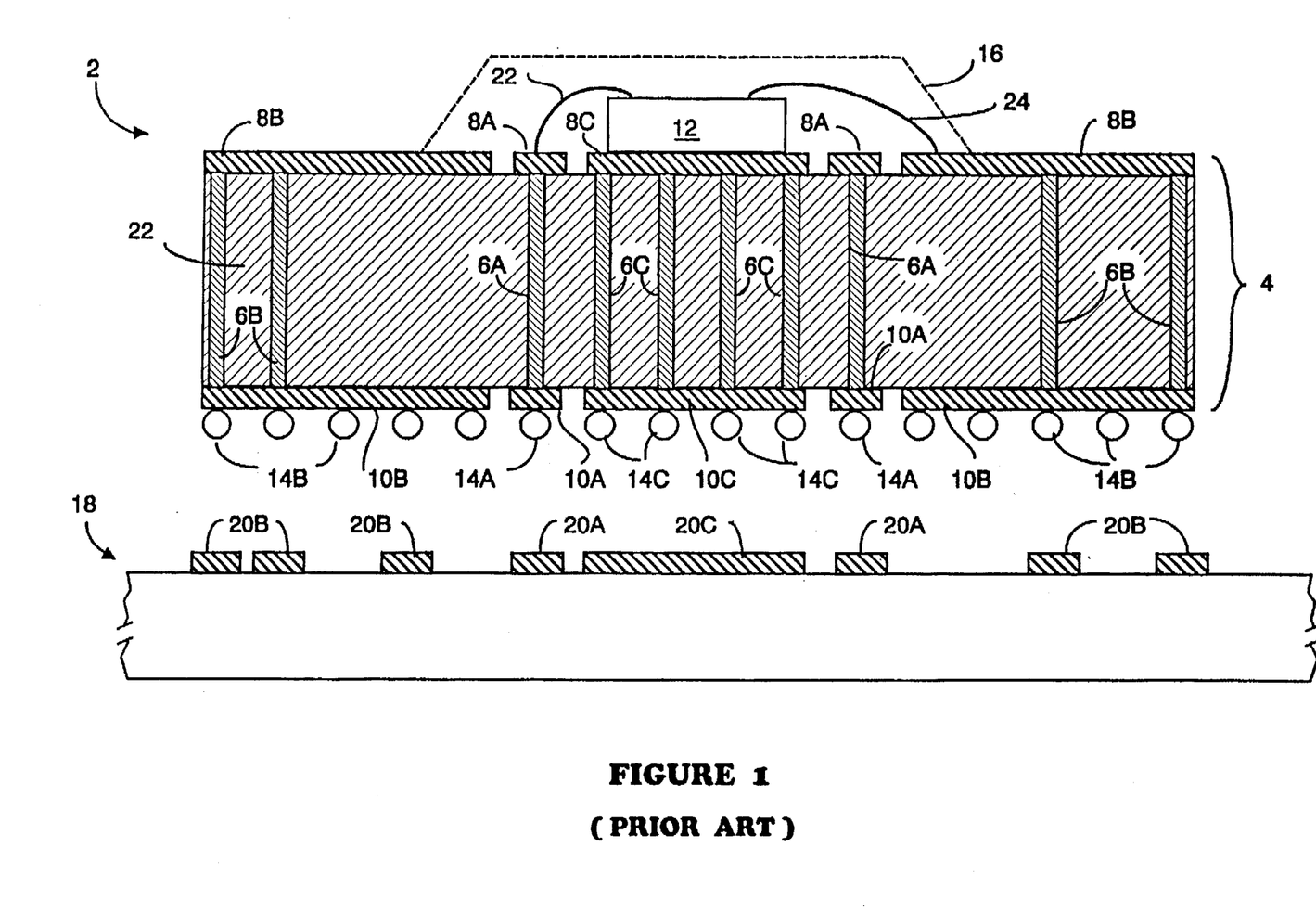
FIG. 1 is a sectional view of a conventional two-layer ball grid array configuration for packaging an integrated circuit, according to the prior art.

One packaging system for providing an IC with a large number of pinouts in a relatively small package area is known as the ball grid array ("BGA") package. FIG. 1 depicts a standard two-layer BGA mounting system, similar to the so-called OMNI™ system promoted by Motorola, Inc. In this system, a BGA package 2 includes a double-sided copper clad printed circuit board ("PCB") 4 with conductive and/or thermal vias 6A, 6B, 6C connecting upper BGA package conductive traces 8A, 8B, 8C to lower BGA package conductive traces 10A, 10B, 10C. The 8A traces and the 8B traces may each be donut-shaped, as may the corresponding 10A and 10B traces. The various vias preferably are identical and may be referred to interchangeably as conductive or thermal vias.

The BGA package further includes the IC die 12 to be packaged, and a plurality of meltable solder balls 14A, 14B, 14C in contact with the lower conductive traces 10A, 10B, 10C. The upper and lower BGA package traces 8A, 8B, 8C, 10A, 10B, 10C are typically formed by etching the copper clad upper and lower surfaces of BGA PCB 4. An overmold, shown in phantom as 16, encapsulates and thus protects the IC die 12. Overmold 16 could, of course, be sized to extend over a greater or lesser portion of the upper surface of BGA package 2 than what is depicted in FIG. 1.

Package 2 will eventually be soldered to a system printed circuit board ("PCB") 18, whose upper surface includes conductive traces 20A, 20B, 20C that will contact various of the solder balls 14A, 14B, 14C. Thus, while FIG. 1 shows BGA package 2 and system PCB 18 spaced apart vertically, in practice the solder balls and the system PCB traces are placed in contact with one another, whereupon an infrared reflow process melts the solder balls. Upon melting, the solder balls electrically and mechanically join various of the BGA package traces 10A, 10B, 10C to various of the system PCB traces 20A, 20B, 20C. The various solder balls may be arrayed in a relatively dense matrix, with adjacent balls being spaced-apart horizontally perhaps 0.050" to 0.060" (1.3 mm to 1.5 mm). As a result, BGA package 2 can advantageously provide a dense pattern of pinout connections with IC 12.

Those skilled in the art will appreciate that IC 12 may include various semiconductor devices such as bipolar or metal-oxide-semiconductor ("MOS") transistors, as well as effective resistor and capacitor components. These transistors and components will form one or more circuits that are typically coupled to an upper power source Vdd, and to a lower power source Vss (usually ground).

Bonding wires such as 22, 24 make electrical connection from pads formed on IC 12 (not shown) to a BGA package trace or plane formed by etching the copper clad on the upper surface of BGA structure 2. Bond wire 22, for example, connects to a BGA package Vdd upper plane trace 8A that connects to a conductive via 6A, which connects to a BGA package Vdd lower plane trace 10A that connects to a solder ball 14A. On the underlying system PCB 18, one or more system PCB traces 20A couple to the Vdd power source that is connected to the system PCB 18. In similar fashion, one or more bond wires (not shown) will couple IC 12 to Vss on the system PCB 18.

Similarly, bonding wire 24 is shown coupled to an upper signal BGA package trace 8B that is connected to vias 6B, to BGA package lower signal trace 10B, and signal solder balls 14B. On system PCB 18, system PCB traces 20B couple electrical signals to or from IC 12. Other bonding wires will also be present but are not shown for ease of illustration. Of course, IC 12 will generally be coupled by various bond wires, upper BGA package traces, vias, lower BGA package traces to various different signal solder balls, for contact with various system PCB 18 signal traces.

As shown in FIG. 1, the lower substrate surface of IC 12 is connected to a BGA package IC die Vss plane 8C, that connects through several vias 6C to a BGA package lower surface Vss plane 10C to which solder balls 14C are attached. As noted, Vss connections to IC 12 generally are also brought out through Vss IC pads, bond wires, traces, vias, traces and solder balls in a manner similar to what is described herein with respect to the connections for Vdd. The underlying system PCB 18 includes a system PCB Vss ground plane 20C that electrically connects to such Vss solder balls, including solder balls 14C.

BGA package 2 is relatively economical to manufacture because PCB 4 may be a symmetrical and relatively inexpensive generic commodity. By symmetrical, it is meant that PCB 4 is manufactured with copper clad on the upper and lower surfaces of a typically epoxy glass core 22, commonly referred to as FR4 material. (It is from this copper clad that the upper and lower BGA package traces or planes 8A, 8B, 8C, 10A, 10B, 10C are formed.) Alternatively, core 22 may be fabricated from an adhesive-like resin commonly termed pre-preg.

It is important that PCB 4 be sufficiently rigid so that the various solder balls will register properly for soldering to corresponding system PCB traces. As a result, the vertical thickness of core 22 in FIG. 1 will typically be at least 0.02" to 0.03" (0.5 mm to 0.8 mm).

Although the BGA configuration of FIG. 1 has the advantage of being inexpensive to fabricate, it has several shortcomings. Specifically, BGA 4 does not provide a good signal plane for current surges into or out of IC 12, and does not do a good job of dissipating heat generated by IC 12. The relatively poor electrical and thermal performance associated with BGA structure 4 is especially apparent when IC 12 includes high density, high frequency digital circuitry. Essentially these performance shortcomings arise because the efficient system Vss and Vdd planes on PCB 18 are too far away from IC 12 to be truly effective.

Thermally, although the system PCB Vss plane 20C can sink heat dissipated by IC 12 and down-conducted through vias 6C, the system PCB Vss plane is just too remote for good dissipation. The prior art configuration of FIG. 1 has a thermal resistance $\theta_{ja}$ of about 35° C./W, which means that for an increase of one Watt dissipation, the junction temperature of the IC die 12 will increase 35° C. As a result, IC 12 may overheat, or require bulky and relatively expensive heat sinking. Alternatively, IC 12 may have to be operated at a lower equivalent duty cycle to reduce dissipation, thus sacrificing IC 12 performance because of the poor thermal characteristics associated with prior art two-layer BGA packages.

Electrically, the current paths from the system PCB Vdd plane 20A, up into IC 12, through the system Vss plane 20C, and vice versa, are simply too long. As will be described, these long path lengths can result in the Vdd and Vss potentials within IC 12 impermissibly varying in magnitude during current surges. What occurs is that an effective inductance L exists in series with the relatively long power supply current paths. Large mutual inductances may be present that force some transient surge ground current to return undesirably through IC 12, rather than through the system PCB planes. This IC 12 transient surge current flow can cause ground bounce and crosstalk between various circuits within IC 12. In addition, the effective inductance L can contribute to an undesirable time delay for signals propagating through IC 12.

More specifically, an excessively long path between a signal node on the IC chip and a signal return ground plane increases the effective series inductance (L) therebetween. In the presence of current spikes through such path, the voltage at the Vss pad(s) and/or Vdd pad(s) within IC 12 can deviate or "bounce" from their nominal DC voltage.

Consider, for example, the effect of a relatively long current return path for a high speed CMOS digital circuit fabricated within IC 12. The output of circuit typically will include a PMOS pull-up and an NMOS pull-down transistor coupled in series between Vdd and Vss. When outputting a digital "1", the NMOS transistor is off, and the PMOS transistor is on, and the circuit sources current from Vdd through the PMOS transistor to an output load coupled to Vss. When outputting a digital "0", the PMOS transistor is off, the NMOS transistor is on and sinks current from the output load.

But when this CMOS circuit changes states from "1" to "0" or vice versa, for a brief interval the PMOS and NMOS transistors may both be simultaneously on due to imperfect switching. When both transistors are on during transitions a rapid change (or "spike") in current (di/dt) through the circuit can occur. In the presence of series inductance L, current spiking results in an L di/dt≈dV/dt change or "bounce" in the voltage present at the Vdd and/or Vss pads on IC 12. Ground bounce results from this dV/dt for Vdd and/or Vss within IC 12.

Such voltage bouncing within IC 12 is especially troublesome at "0" to "1" transitions because CMOS transistors exhibit less noise immunity margin for error near "0" voltage states as contrasted to "1" voltage states. For this reason, it is especially important that a low inductance impedance Vss path within IC 12 be maintained.

In addition to producing overshoot and undershoot on output voltage waveforms, ground bounce can degrade digital switching reliability. This degradation occurs because any variations in Vdd or Vss within IC 12 can alter CMOS trip points.

Generally, the configuration of FIG. 1 will exhibit an output impedance between a signal output pad on IC 12 and Vss of about 250 Ω. A 250 Ω output impedance is undesirably high for matching to a system PCB that typically is characterized by an impedance in the 50 Ω to 75 Ω range. The resultant impedance mismatch contributes to overshoot and ringing on signals coupled from the BGA package to the system PCB. The configuration of FIG. 1 also exhibits an effective series inductance of perhaps 12 nh to 15 nh, and an equivalent output shunt capacitance at a signal output pad of about 1.2 pF.

As noted, the series inductance can produce overshoot and ringing in IC 12 signals, especially when a relatively light capacitive load is to be driven. Further, the series inductance and shunt capacitance associated with the two-layer BGA package of FIG. 1 can undesirably delay a signal passing through IC 12 by several nanoseconds. If IC 12 includes high speed switching devices (e.g., wherein the operating frequency is greater than perhaps 30 MHz), a BGA package-imposed time delay of a few nanoseconds may be unacceptable.

In summary, there is a need for a BGA package having improved thermal and electrical characteristics, especially for high speed digital ICs. To reduce ground bounce and enhance IC operating reliability, such BGA package should exhibit approximately 50 Ω output impedance and decreased effective series inductance. Further, it should be possible to manufacture such a BGA package using generic symmetrical PCB materials.

The present invention discloses such a BGA package.

SUMMARY OF THE PRESENT INVENTION

In a first three-layer embodiment, the present invention provides a BGA package with a BGA Vss plane disposed between the upper and lower BGA package traces. Further, this embodiment also provides upper and lower BGA package Vss traces on the outer periphery of the BGA package, to help maintain a low impedance between an IC packaged with the three-layer embodiment, and the BGA Vss plane. This embodiment is three-layered in that there are traces at the upper surface of the BGA package, there is an intermediate BGA Vss plane, and there are traces at the lower surface of the BGA package.

The additional BGA Vss plane preferably is a copper clad surface on a portion of PCB material from which the BGA package is fabricated. IC-generated heat is coupled from the BGA package IC die Vss trace through vias to the BGA Vss plane, through the lower portion of the same vias to the BGA package Vss trace on the lower surface of BGA package, as well as to a Vss plane on the underlying system PCB. The BGA Vss plane is closer to the IC than is the underlying system PCB, and thus performs an IC heat sinking function by lowering thermal resistance $\theta_{ja}$.

The BGA Vss plane also provides a closer Vss plane for sinking current output by the IC than is provided by the underlying PCB Vss plane. The presence of this closer Vss plane reduces series inductance to the IC, reduces ground bounce, at least for IC output signals transitioning from "1" to "0", and reduces time delay through the IC. While the closer Vss plane reduces series inductance, closer Vss plane proximity to the IC slightly increases shunt capacitance as seen by a BGA package upper surface trace to Vss. However, the slight increase in shunt capacitance appears beneficial in reducing noise seen by the IC.

A more preferred embodiment of the present invention provides a four-layer BGA package that is similar to the above-described three-layer embodiment, except that a BGA Vdd plane is also provided intermediate the BGA Vss plane and the traces on the lower surface of the BGA package. This embodiment is preferred because it may be fabricated from two pieces of symmetrical printed circuit board material, and because it reduces ground bounce for "0" to "1", as well as for "1" to "0" IC output signal transitions.

The BGA Vdd plane provides a plane that is relatively closer to the IC than is the underlying PCB Vdd plane, and reduces series inductance when the IC source current, as in a "0" to "1" output signal transition. This "0" to "1" ground bounce improvement is in addition to the "1" to "0" current sinking improvement afforded by the BGA Vss plane, which also improves heat sinking.

Because it provides an even number of planes, the four-layer embodiment is preferred for ease of fabrication. This embodiment may be manufactured using two pieces of symmetrical double clad PCB material, wherein the clad on each piece of material provides two planes. As such, this embodiment provides technical advantages in ease and economy of fabrication over a three layer embodiment.

Further, when compared to a-prior art two-layer BGA package, a four-layer embodiment according to the present invention reduces series inductance by about 50%, reduces the effective output impedance from about 250 Ω to about 50 Ω, and increases shunt capacitance to about 1.3 pF. When compared to a. prior art two-layer BGA package, the four-layer embodiment reduces time delay through the packaged IC by about 2 ns, and improves thermal dissipation by about 50%.

Other features and advantages of the invention will appear from the following description in which the preferred embodiments have been set forth in detail, in conjunction with the accompanying drawings.

DETAILED DESCRIPTION OF THE PREFERRED EMBODIMENT

Figure 2:
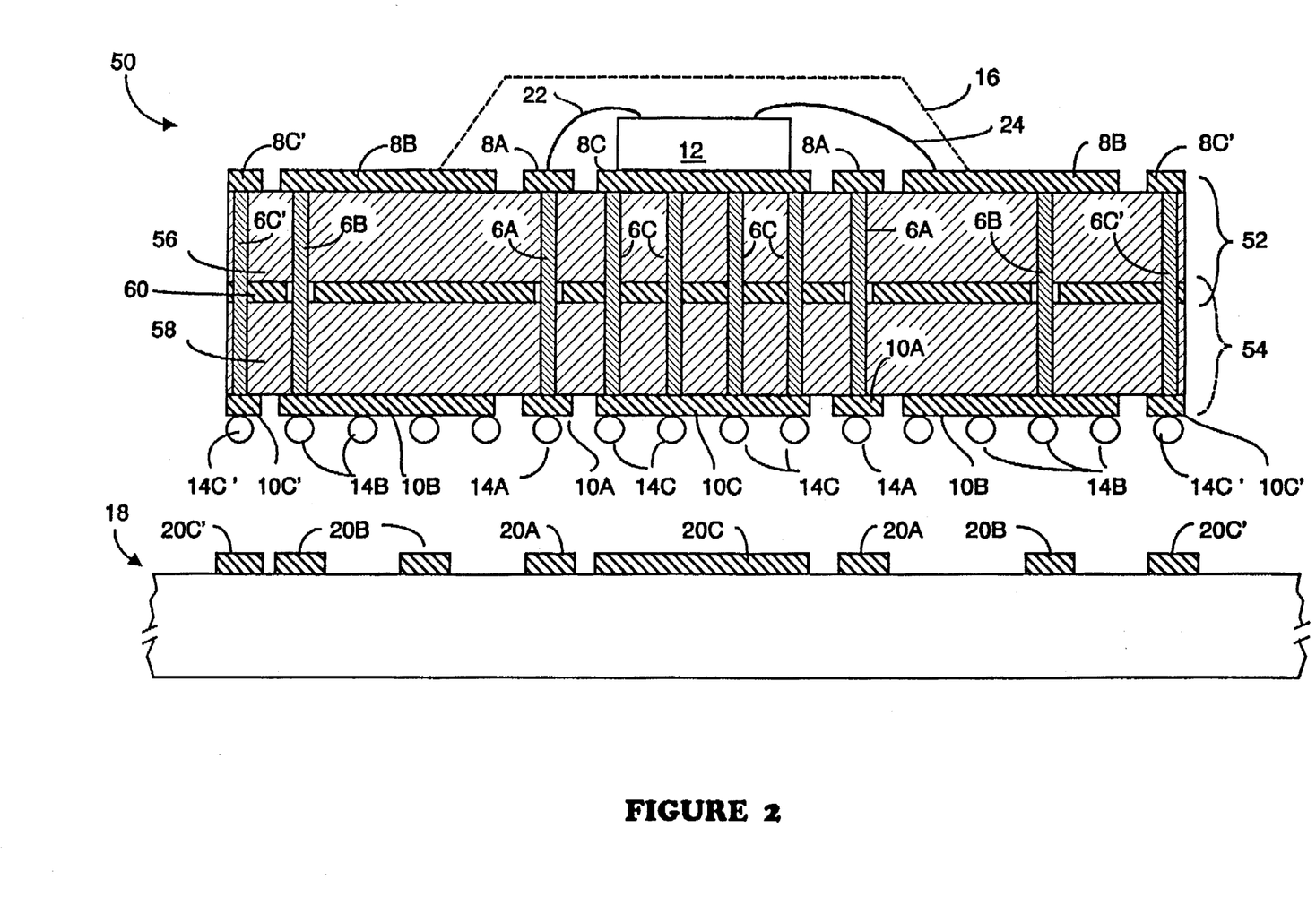
FIG. 2 is a sectional view of a three-layer ball grid array configuration for packaging an integrated circuit, according to the present invention.

In a first three-layer embodiment shown in FIG. 2, the present invention provides a BBA package 50 with a BGA Vss plane 60 disposed between the upper and lower BGA package traces 8A, 8B, 8C', and 10A, 10B, 10C, 10C'. Among these BGA package traces, the present invention adds upper and lower BGA package Vss traces 8C, 10C' on the outer periphery of the BGA package. This embodiment is three-layered in that there are traces 8A, 8B, 8C, 8C' at the upper surface of the BGA package, there is an intermediate BGA Vss plane 60, and there are traces 10A, 10B, 10C, 10C' at the lower surface of the BGA package.

The embodiment of FIG. 2 improves thermal dissipation performance and partially improves electrical performance in a BGA package when compared to the two-layer embodiment of FIG. 1. These improvements result by providing a BGA Vss plane 60 relatively close to IC die 12, and by optionally providing outer Vss planes 8C', 10C' (and associated vias 6C' and outer solder balls 14C'). Outer planes or traces 8C', 10C' may be donut-shaped, and are coupled together by the BGA Vss plane 60, to which planes or traces 8C, 10C are also coupled. This coupling is affected by the vias 6C, 6C' which pass tightly through via-sized openings in plane 60 such that electrical (and thermal) contact results. By contrast, all other vias (e.g., 6A, 6B) pass through oversized openings in plane 60 that are sufficiently large as to not make electrical (or thermal) contact with the Vss plane 60.

As was the case in FIG. 1, an IC die 12 mounted within the BGA package has its substrate coupled to a BGA package IC die Vss trace or plane 8C on the upper surface of the BGA package. A plurality of vias 6C, 6C' electrically and thermally couple the BGA Vss plane 60 to the BGA package IC die Vss trace 8C, and to the outer periphery traces 8C', 10C' on the upper and lower BGA package surfaces. Vss solder balls couple the various Vss traces on the lower BGA package surface to corresponding Vss planes on an underlying system PCB. As in the prior art, Vdd solder balls couple the various Vdd and signal traces on the lower BGA package surface to corresponding traces and planes on the underlying system PCB. Vdd vias 6A and signal vias 6B also couple respective Vdd and signal traces 8A, 14A and 8B, 14B.

It is understood that the BGA Vss plane 60 makes electrical contact with the Vss vias 6C, 6C', but not with the Vdd vias 6A or the signal vias 6B. Electrical connection with vias 6A, 6B is avoided by defining through openings in the BGA Vss plane 60 sufficiently large to permit vias 6A, 6B to pass through without contact between the outer wall of the via and the inner surface of the opening in plane 60. By contrast, the Vss vias 6C, 6C' pass through openings defined in plane 60 that will result in electrical contact.

The additional BGA Vss plane preferably is a copper clad surface on a portion of PCB material from which the BGA package is fabricated. In FIG. 2, BGA Vss plane may be either the lower copper clad on a piece of symmetrical printed circuit board material 52 whose core is shown as 56, or he upper copper clad on a piece of symmetrical printed circuit board material 54 whose core is shown as 58. Typically, core 56 and core 58 will typically have a combined thickness of at least 0.02" to 0.03" (0.5 mm to 0.8 mm) to provide rigidity for BGA package 50. In practice, core 56 may be relatively thin (e.g., 0.005" or 0.13 mm) material to place BGA Vss plane 50 closer to IC 12. If desired, the thickness of core 58 may be increased to compensate for a thinner core 56, to maintain overall rigidity for BGA package 50.

Thermally, heat from IC 12 is coupled from the BGA package IC die Vss trace 12 through vias 6C to the BGA Vss plane 60, through the lower portion of the same vias to the BGA package Vss trace 14C on the lower surface of BGA package 50. From trace 14C, conduction to the Vss plane 20C on the system PCB 18 occurs (after soldering of BGA package 50 to the system PCB 18). The BGA Vss plane 60 may be relatively closer to the IC than is the underlying system PCB 18, and will thus sink heat and allow IC 12 to operate at a lower package temperature. A three-layer BGA package as depicted in FIG. 2 will exhibit a $\theta_{ja}$ of about 20° C./W.

Electrically, the BGA Vss plane 60 provides a closer and lower impedance Vss plane for sinking current output by IC 12 than is provided by the underlying PCB Vs plane 20C. The closer proximity of this Vss plane to IC 12 actually increases slightly the shunt capacitance by perhaps 0.1 pF. In practice, this slight capacitance increase can help IC 12 performance by emulating a small decoupling capacitor that is moved closer to the IC. Although on IC signal output pads further shunt capacitance is undesired, the relative increase is small, e.g., from about 1.2 pF to about 1.3 pF.

As shown in FIG. 2, the upper surface of BGA package 50 provides both a central BGA package IC die Vss trace 8C, and peripheral BGA package traces 8C'. As noted, these traces 8C, 8C' are coupled through vias 6C, 6C' to the BGA Vss plane 60 to corresponding traces 10c, 10C' on the lower surface of the BGA package, and thence through solder balls 14C, 14C' to corresponding traces 20C, 20C' on the system PCB 18.

So coupled, BGA Vss plane 60 advantageously reduces series inductance to IC 12, thus reducing ground bounce, at least for IC output signals transitioning from "1" to "0". The outer periphery BGA package traces 8C', 10C' and their associated vias and solder balls help maintain a low impedance between IC 12 and the BGA Vss plane 60, and thus help ensure that return current is present in the BGA Vss plane. If the outer BGA package Vss traces 8C', 14C' and associated vias and solder balls were eliminated, the ground bounce improvement otherwise available from BGA package 50 would suffer degradation, perhaps in the 40% range.

During a "1" to "0" IC output signal transition, a low impedance ground current return path is present in BGA Vss plane 60, since the effective series inductance L is minimized. As a result, IC 12 is not forced to provide a substantial current return path, and any $dV \approx Ldi/dt$ voltage changes at the Vss pad within IC 12 are relatively minimal during "1" to "0" output voltage transitions. In this fashion, the Vss pad within IC 12 can maintain a relatively stable potential with minimum voltage bounce, at least during DC and "1" to "0" output voltage conditions, with attendant current sinking.

Although the embodiment of FIG. 2, provides improved thermal and electrical performance when compared to the prior art configuration of FIG. 1, a three-layered embodiment is difficult to fabricate economically. As noted, BGA Vss plane may be either the lower surface of a PCB 52, or the upper surface of a PCB 54. As such, one of PCB 42 and 54 must be single sided, which is to say a non-symmetrical PCB. Combining a generic double-sided PCB with a single-sided PCB using, for example, pre-preg material is expensive, time consuming, and simply not a preferred mode of construction. Similarly, coating a copper clad surface on a symmetrical PCB (e.g., 52) with a pre-preg material (e.g. 58) that is then clad with copper (e.g., layer 10) is likewise not a preferred mode of construction. Further, the three-layered embodiment of FIG. 2 minimizes ground bounce during IC current sourcing transitions only, and does not improve ground bounce for IC current sinking transitions.

Figure 3:
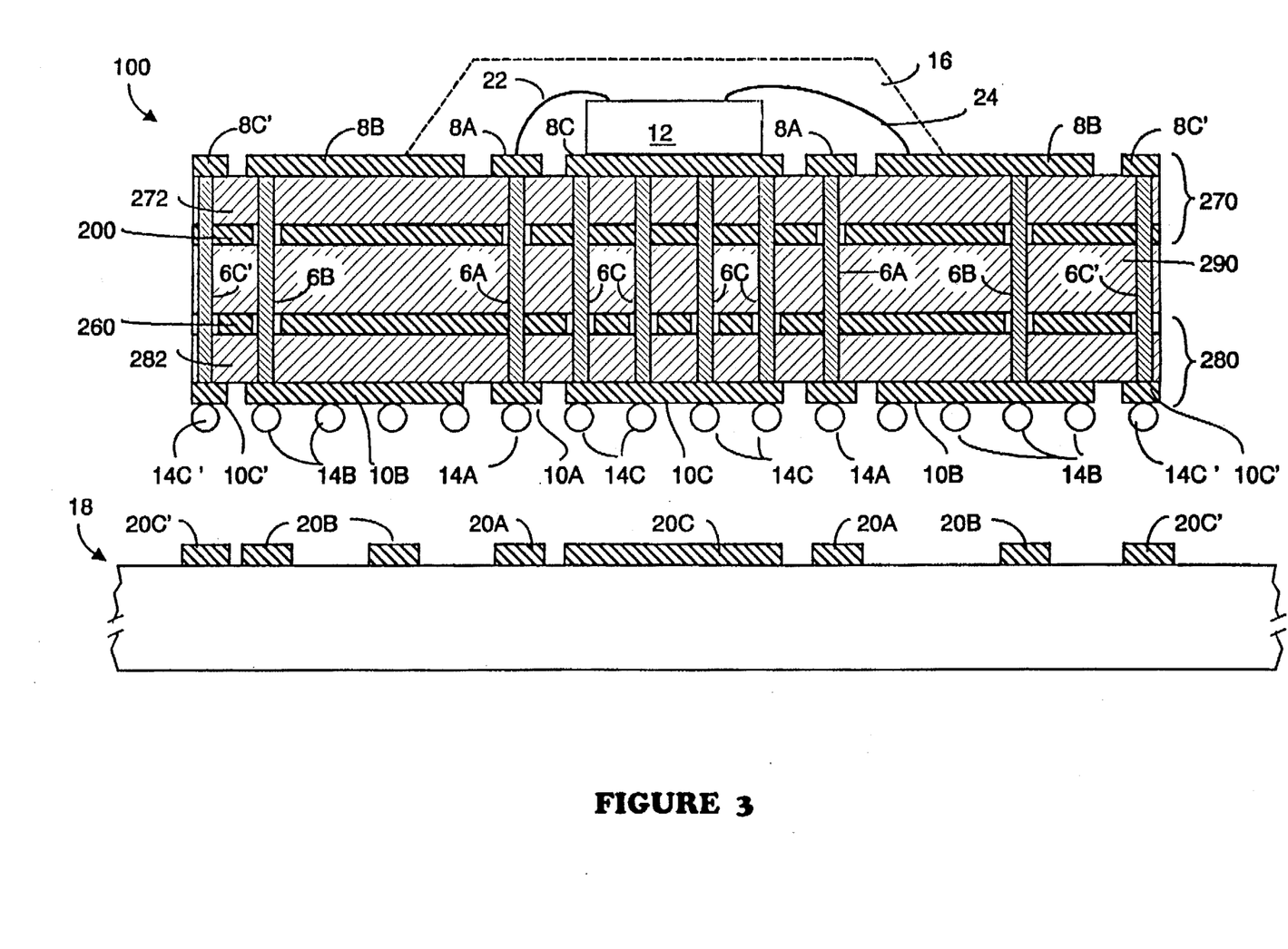
FIG. 3 is a sectional view of a four-layer ball grid array configuration for packaging an integrated circuit, according to the present invention.

FIG. 3 depicts a more preferred embodiment of the present invention, wherein a four-layer BGA package 100 is provided. This embodiment is somewhat similar to the above-described three-layer embodiment, except that a BGA Vdd plane 260 is also provided intermediate a BGA Vss plane 200 and the traces on the lower surface of the BGA package. This embodiment is preferred because it reduces ground bounce for "0" to "1" and for "1" to "0" IC output transitions. Further, this embodiment exhibits improved heat dissipation and advantageously may be fabricated from two pieces of symmetrical printed circuit board material.

Thermally, the four-layer embodiment of FIG. 3 has a $\theta_{ja}$ of about 15° C./W. which compares very favorably to the 35° C./W rating of a prior art two-layer embodiment. For a given dissipation, IC 12 packaged in the four-layer embodiment of FIG. 3 can safely dissipate about twice as much heat as can the same IC in a prior art two-layer BGA package. Thus, while the two-layer packaged IC would require the additional expense and volume associated with heat sinking, heat sinking may be avoided by using the four-layer package described herein.

More specifically, as shown in FIG. 3, a four-layer BGA package 100 provides a BGA Vss plane 200 and a BGA Vdd plane 260 disposed intermediate upper and lower BGA package conductive traces 8A, 8B, 8C, 8C', and 10A, 10B, 10C and 10C'. As in the embodiment of FIG. 2, at least a portion of these upper and lower BGA package traces or places are in vertical registration to permit coupling therebetween using one or more vias.

Because it is generally more important to reduce bounce at an IC Vss pad than at the IC Vdd pad due to decreased "0" level noise margins, the BGA Vss plane 200 preferably is placed closer to IC 12 than is the BGA Vdd plane 260. Similar to what was described with respect to FIG. 2, the addition of the BGA Vss plane decreases series inductance substantially, but increases slightly the shunt capacitance as seen by a signal pad on the IC. However, the approximately 0.1 pF increase (e.g., from 1.2 pF without BGA Vss plane to about 1.3 pF) appears beneficial in decoupling the IC signal lines from noise.

In FIG. 3, the Vss vias 6C, 6C' make electrical and thermal connection with the BGA Vss plane 200, but not with the underlying BGA Vdd plane 260. Similarly, the Vdd vies 6A are electrically insulated from the BGA Vss plane 200, but make electrical contact with the BGA Vdd plane 260. The various signal vies 6B are electrically insulated from both planes 200, 260. Such insulation can result from defining a relatively large opening in plane 200 and/or 260 through which a via passes that is not to make electrical contact with the plane.

As in the three-layer embodiment, vies 6A, 6B, 6C, 6C' connect corresponding upper and lower BGA package traces 8A, 8B, 8C, 8C' and 10A, 10B, 10C, 10C', with vias 6C thermally conducting heat from the die Vss plane 8C to the BGA Vss plane 200, and thence downward. As described with respect to FIG. 2, solder balls 14A, 14B, 14C, 14C' provide electrical contact with corresponding traces 20A, 20B, 20C, 20C' on an underlying system PCB 18.

While vias 6C may also thermally conduct heat to the BGA Vdd plane 260 and the underlying system PCB ground plane or trace 20C, the Vdd plane 260 serves a relatively minor role in heat dissipation. More importantly, BGA Vdd plane 260 advantageously provides a Vdd plane that is relatively closer to IC 12 than is the underlying PCB Vdd plane or trace 20A. As a result, series inductance to IC 12 is reduced when the IC sources current, as in a "0" to "1" output signal transition. Further, as noted, the BGA Vss plane 200 reduces series-inductance when IC 12 sinks current, as in a "1" to "0" output signal transition.

The four-layer embodiment is preferred for ease of fabrication in that it can be manufactured using two pieces of symmetrical double clad PCB material 270, 280 with a core 290 therebetween. As such, PCB 270 has a core 272 sandwiched between copper clad layers defining the BGA package upper traces 8A, 8B, 8C, 8C' and the BGA Vss plane 200. PCB 280 has a core 282 sandwiched between copper clad layers defining the BGA Vdd plane 260 and the BGA package lower traces 10A, 10B, 10C, 10C'. Cores 272 and 282 may advantageously be conventional 0.005" (0.13 mm) FR4 epoxy glass material, joined together by a pre-preg core 290 whose thickness is whatever is desired to provide necessary rigidity for the BGA package 100, e.g., perhaps 0.020" to 0.060" (0.5 mm to 1.5 mm).

Compared to a prior art two-layer BGA package, the four-layer embodiment of FIG. 3 can reduce series inductance to about 6 nh to about 9 nh, and can reduce the effective IC output impedance to about 50 Ω. A 50 Ωoutput impedance advantageously permits high frequency signals from IC 12 to match 50 Ω transmission lines formed on the system PCB 18.

Figure 4:
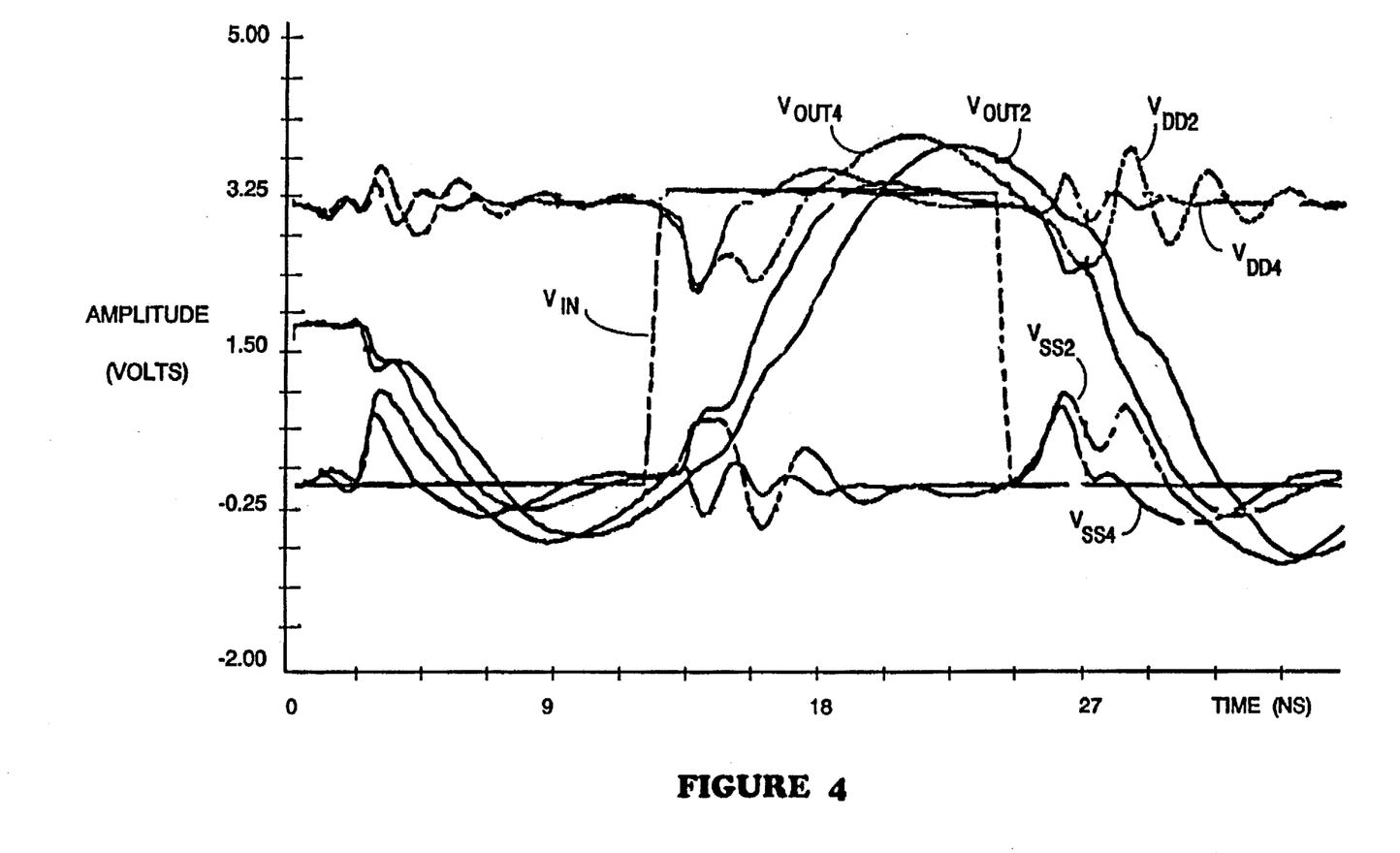
FIG. 4 is a computer simulation comparing voltage waveforms for the four-layer embodiment of FIG. 3 and the two-layer embodiment for FIG. 1, for a CMOS buffer integrated circuit.

FIG. 4 depicts a computer simulation showing the response of an IC buffer encapsulated in a four-layer BGA package as shown in FIG. 3, as contrasted with the same buffer packaged in the prior art two-layer configuration of FIG. 1. In each simulation, a positive-going pulse ($V_{IN}$) was provided as input, and a relatively heavy 50 pF load was assumed. $V_{OUT4}$ represents the voltage output of the four-layer configuration of FIG. 3, and $V_{OUT2}$ represents the voltage output of the two-layer prior art configuration of FIG. 1. Because of the heavy capacitive load, neither output voltage waveform exhibits ringing. However, the decreased series inductance associated with the four-layer embodiment is apparent by the approximately 2 ns decrease in delay as contrasted with the delay in $V_{OUT2}$. At the top and bottom of FIG. 4, $V_{dd4}$, $V_{dd2}$, $V_{ss4}$ and $V_{ss2}$ depict the upper and lower power supply signals as seen at the IC. In each instance, supply voltages at the IC associated with the four-layer embodiment are cleaner and exhibit less bounce than the corresponding two-layer embodiment signals.

The improved voltage waveforms shown in FIG. 4 result from diminished ground bounce in the four-layer package due to decreased effective series inductance. It will be appreciated that in a digital system comprising perhaps thousands of digital ICs that overall system reliability is enhanced by providing a four-layer BGA package according to the present invention. A more predictable noise margin is attained, and a more stable performance is realized, especially under increased ambient temperature, wherein the present invention advantageously permits the encapsulated IC to operate at lower junction temperature without heat sinking.

Other features and advantages of the invention will appear from the following description in which the preferred embodiments have been set forth in detail, in conjunction with the accompanying drawings. Modifications and variations may be made to the disclosed embodiments without departing from the subject and spirit of the invention as defined by the following claims.

What is claimed is:

1. A method of packaging an integrated circuit (IC) in a ball grid array (BGA) package that has improved BGA package thermal and electrical characteristics, comprising:

forming upper layer BGA package traces including a Vss trace, a Vdd trace, and a signal trace;

forming lower layer BGA package traces at least a portion of which traces are in vertical alignment with a corresponding one of said upper layer BGA package traces;

wherein solder balls may be attached to regions of said lower layer BGA package traces to solder said BGA package to an underlying system printed circuit board;

disposing a BGA core material between said upper and lower layer BGA package traces;

forming vias that include:

a unitarily-constructed Vss via coupling said upper layer BGA Vss trace to a corresponding lower layer BGA Vss trace;

a unitarily-constructed Vdd via coupling said upper layer BGA Vdd trace to a corresponding lower layer BGA Vdd trace;

a unitarily-constructed signal via coupling a said upper layer BGA signal trace to a corresponding lower layer BGA signal trace; and disposing a BGA Vss plane intermediate said upper and lower layer BGA package traces and making electrical contact with said Vss vial;

wherein said BGA Vss plane so disposed improves thermal dissipation and electrical characteristics of said BGA package.

2. The method of claim 1 further including disposing a BGA Vdd plane intermediate said BGA Vss plane and said lower layer BGA package traces and making electrical contact with said Vdd via.

3. The method of claim 2, wherein a chosen one of (a) said upper layer BGA package traces, a portion of said BGA core material and said BGA Vss plane, and (b) said BGA Vdd plane, a portion of said BGA core material, and said lower layer BGA package traces is fabricated with doubled-sided printed circuit board material.

4. The method of claim 1, wherein:

said upper layer BGA package traces include a first Vss trace disposed over a center region of said package, and a second Vss trace disposed over a peripheral region of said package;

further including providing a first unitarily-constructed Vss via coupling said first Vss trace to a corresponding lower layer BGA first Vss trace; and providing a second unitarily-constructed Vss via coupling said second Vss trace to a corresponding lower layer BGA second Vss trace.

5. The method of claim 1, further including fabricating said BGA core material from a material selected from the group consisting of (a) FR4 epoxy glass, and (b) pre-preg.

6. The method of claim 1, wherein said BGA Vss plane is vertically spaced-apart from a substrate of said IC a distance less than about 0.03" (0.8 mm).

7. The method of claim 1 wherein said upper layer BGA package Vss trace includes a BGA package IC die plane that is solderable to a substrate of said IC.

8. A method of packaging an integrated circuit (IC) in a three-layer ball grid array (BGA) package that has improved BGA package thermal and electrical characteristics, comprising:

providing a first BGA core sandwiched between first and second surfaces clad with conductive material;

said conductive material on said first surface defining at least a first BGA package surface Vdd plane, a first BGA package surface signal trace, and a first BGA package surface Vss plane;

said conductive material on said second surface forming a BGA Vss plane having at least three via openings defined therethrough;

providing a second BGA core whose first surface contacts said BGA Vss plane, and whose second surface defines at least a second BGA package surface Vdd plane a portion of which is in vertical registration with said first BGA package surface Vdd plane, a second BGA package surface signal track portion of which is in vertical registration with said first BGA package surface signal trace, and a second BGA package surface Vss plane a portion of which is in vertical registration with said first BGA package surface Vss plane;

providing a unitarily-constructed Vdd via coupling said first BGA package surface Vdd plane and said second BGA package surface Vdd plane and passing through a via opening in said BGA Vss plane without contacting said BGA Vss plane;

providing a unitarily-constructed signal via coupling said first BGA package surface signal trace and said second BGA package surface signal trace and passing through an opening in said BGA Vss plane without contacting said BGA Vss plane; and providing a unitarily-constructed Vss via coupling said first BGA package surface Vss plane and said second BGA package surface Vss plane and passing through an opening in said BGA Vss plane while contacting said BGA Vss plane;

wherein said IC includes a substrate to be coupled to a chosen one of said first BGA package surface Vss plane and said second BGA package surface Vss plane, and wherein said IC further includes a signal pad coupled by a bond wire to a signal trace on the chosen first or second BGA package surface to which said substrate is coupled, and wherein said IC further includes a Vdd pad coupled by a bond wire to a Vdd plane on the chosen first or second BGA package surface to which said substrate is coupled;

wherein said BGA Vss plane and said BGA Vdd plane so disposed improve thermal dissipation and electrical characteristics of said BGA package;

providing solder balls to contact traces and planes on the unchosen of said first or second BGA package surface.

9. The method of claim 8, wherein:

said first BGA package surface Vss plane includes a first Vss trace disposed over a center region of said package, and a second Vss trace disposed over a peripheral region of said package;

said second BGA package surface Vss plane includes a first Vss trace disposed under a center region of said package, and a second Vss trace disposed under a peripheral region of said package; and further including:

providing a first unitarily-constructed Vss via coupling said first Vss trace on said first BGA package surface Vss plane to said first Vss trace on said second BGA package surface Vss plane; and providing a second unitarily-constructed Vss via coupling said second Vss trace on said first BGA package surface Vss plane to said second Vss trace on said second BGA package surface Vss plane.

10. The method of claim 8, wherein said first BGA core sandwiched between first and second surfaces clad with conductive material comprises a double-sided printed circuit board.

11. The method of claim 8, wherein said BGA Vss plane is vertically spaced-apart from said substrate of said IC a distance less than about 0.03" (0.8 mm).

12. The method of claim 8, wherein at least one of said first and second BGA core includes a material selected from the group consisting of (a) FR4 epoxy glass, and (b) pre-preg.

13. A method of packaging an integrated circuit (IC) in a four-layer ball grid array ("BGA") package having improved BGA package thermal and electrical characteristics, comprising:

providing a first BGA core sandwiched between first and second surfaces clad with conductive material;

said conductive material on said first surface defining at least a first BGA package surface Vdd plane, a first BGA package surface signal trace, and a first BGA package surface Vss plane;

said conductive material on said second surface forming a BGA Vss plane having at least three via openings defined therethrough;

providing a second BGA core sandwiched between first and second surfaces clad with conductive material;

said conductive material on said first surface defining a BGA Vdd plane and having at least three via openings defined therethrough;

said conductive material on said second surface defining at least a second BGA package surface Vdd plane a portion of which is in vertical alignment with said first BGA package surface Vdd plane, a second BGA package surface signal trace a portion of which is in vertical alignment with said first BGA package surface signal trace, and a second BGA package surface Vss plane a portion of which is in vertical registration with said first BGA package surface Vss plane;

providing a unitarily-constructed Vdd via coupling said first BGA package surface Vdd plane, said second BGA package surface Vdd plane, and said BGA Vdd plane by passing through a via opening therein while contacting said BGA Vdd plane, said unitarily-constructed Vdd via passing through a via opening in said BGA Vss plane without contacting said BGA Vss plane;

providing a unitarily-constructed signal via coupling said first BGA package surface signal trace and said second BGA package surface signal trace and passing through vertically aligned via openings in said BGA Vss plane and in said BGA Vdd plane without contacting either said BGA Vss plane and BGA Vdd plane;

providing a unitarily-constructed Vss via coupling said first BGA package surface Vss plane, said second BGA package surface Vss plane, and said BGA Vss plane by passing through a via opening therein while contacting said BGA Vss plane, said unitarily-constructed Vss via passing through a via opening in said BGA Vdd plane without contacting said BGA Vdd plane; and disposing a third BGA core intermediate said BGA Vss plane and said BGA Vdd plane;

wherein said IC includes a substrate to be coupled to said first BGA package surface Vss plane, and further includes a signal pad coupled to a bond wire coupled to said first BGA package signal trace, and further includes a Vdd pad coupled to a bond wire coupled to said first BGA package Vdd plane;

wherein said BGA Vss plane and said BGA Vdd plane so disposed improve thermal dissipation and electrical characteristics of said BGA package;

providing solder balls to contact traces and planes on said second surface of said second BGA core.

14. The method of claim 13, wherein:

with respect to said first BGA core, said first BGA package surface Vss plane includes a first Vss trace disposed over a center region of said package, and a second Vss trace disposed over a peripheral region of said package;

with respect to said second BGA core, said second BGA package surface Vss plane includes a first Vss trace disposed under a center region of said package, and a second Vss trace disposed under a peripheral region of said package; and further including:

providing a first unitarily-constructed Vss via coupling said first Vss trace on said first BGA package surface Vss plane of said first BGA core to said first Vss trace on said second BGA package surface Vss plane of said second BGA core; and providing a second unitarily-constructed Vss via coupling said second Vss trace on said first BGA package surface Vss plane of said first BGA core to said second Vss trace on said second BGA package surface Vss plane of said second BGA core.

15. The method of claim 13, wherein at least one of said first BGA core sandwiched between first and second surfaces clad with conductive material, and said second BGA core sandwiched between first and second surfaces clad with conductive material comprise a double-sided printed circuit board.

16. The method of claim 13, wherein said BGA Vss plane is disposed closer to said IC than is said BGA Vdd plane.

17. The method of claim 13, wherein said BGA Vss plane is vertically spaced-apart from said substrate of said IC a distance less than about 0.03" (0.8 mm).

18. The method of claim 13, wherein at least one of said first BGA core, said second BGA core, and said third BGA core includes a material selected from the group consisting of (a) FR4 epoxy glass, and (b) pre-preg.

* * * * *

UNITED STATES PATENT AND TRADEMARK OFFICE
CERTIFICATE OF CORRECTION

PATENT NO. : 5,741,729

DATED : April 21, 1998

INVENTOR(S) : SELNA

It is certified that error appears in the above-identified patent and that said Letters Patent is hereby corrected as shown below:

Column 10, claim 1, line 9, immediately following "Vss", delete "vial" and insert therefor --via--.

Column 10, claim 8, line 61, delete "track" and insert therefor --trace a--.

Signed and Sealed this

FourthDay of August, 1998

Attest:

Attesting Officer

BRUCE LEHMAN

Commissioner of Patents and Trademarks